United States Patent [19]

Lien

[11] 4,190,467
[45] Feb. 26, 1980

[54] SEMICONDUCTOR DEVICE PRODUCTION

[75] Inventor: Suei-Yuen P. Lien, West Windsor Township; Mercer County, N.J.

[73] Assignee: Western Electric Co., Inc., New York, N.Y.

[21] Appl. No.: 970,031

[22] Filed: Dec. 15, 1978

[51] Int. Cl.² .................................. H01L 21/225
[52] U.S. Cl. ................................ 148/1.5; 148/171; 148/188
[58] Field of Search ................ 148/1.5, 171, 188

[56] References Cited

U.S. PATENT DOCUMENTS

| | | | |
|---|---|---|---|
| 2,813,048 | 11/1957 | Pfann | 148/1.5 |
| 3,895,967 | 7/1975 | Anthony et al. | 148/1.5 |
| 3,898,106 | 8/1975 | Cline et al. | 148/1.5 |
| 3,899,361 | 8/1975 | Cline et al. | 148/1.5 |
| 3,899,362 | 8/1975 | Cline et al. | 148/1.5 |
| 3,901,736 | 8/1975 | Anthony et al. | 148/1.5 |
| 3,902,925 | 9/1975 | Anthony et al. | 148/1.5 |
| 3,904,442 | 9/1975 | Anthony et al. | 148/1.5 |
| 3,936,319 | 2/1976 | Anthony et al. | 136/89 |
| 3,956,023 | 5/1976 | Cline et al. | 148/1.5 |
| 3,956,024 | 5/1976 | Cline et al. | 148/1.5 |
| 3,956,026 | 5/1976 | Cline et al. | 148/1.5 |
| 3,972,741 | 8/1976 | Anthony et al. | 148/1.5 |
| 3,972,742 | 8/1976 | Cline et al. | 148/1.5 |
| 3,975,213 | 8/1976 | Anthony et al. | 148/1.5 |
| 3,977,910 | 8/1976 | Anthony et al. | 148/1.5 |
| 3,979,230 | 9/1976 | Anthony et al. | 148/1.5 |
| 3,979,820 | 9/1976 | Anthony et al. | 29/577 |
| 3,982,268 | 9/1976 | Anthony et al. | 357/55 |
| 3,982,270 | 9/1976 | Cline et al. | 357/60 |
| 3,988,757 | 10/1976 | Cline et al. | 357/13 |
| 3,988,760 | 10/1976 | Cline et al. | 357/39 |
| 3,988,762 | 10/1976 | Cline et al. | 357/48 |
| 3,988,764 | 10/1976 | Cline et al. | 357/51 |
| 3,988,766 | 10/1976 | Anthony et al. | 357/60 |
| 3,988,768 | 10/1976 | Anthony et al. | 357/60 |
| 3,988,769 | 10/1976 | Anthony et al. | 357/60 |
| 3,988,770 | 10/1976 | Anthony et al. | 357/60 |
| 3,990,093 | 11/1976 | Cline et al. | 357/60 |
| 3,998,653 | 12/1976 | Anthony et al. | 134/1 |
| 3,998,661 | 12/1976 | Chang et al. | 148/1.5 |
| 3,998,662 | 12/1976 | Anthony et al. | 148/1.5 |
| 4,006,040 | 2/1977 | Cline et al. | 148/1.5 |
| 4,010,534 | 2/1977 | Anthony et al. | 29/572 |
| 4,011,582 | 3/1977 | Cline et al. | 357/60 |
| 4,021,269 | 5/1977 | Anthony et al. | 148/1.5 |
| 4,035,199 | 7/1977 | Anthony et al. | 148/1.5 |

Primary Examiner—G. Ozaki
Attorney, Agent, or Firm—J. F. Spivak

[57] ABSTRACT

A thermal gradient zone melting technique is provided for eliminating distortion of the migrated metal pattern by including a peripheral ring of the metal adjacent the edge of the semiconductor wafer.

5 Claims, 5 Drawing Figures

SEMICONDUCTOR DEVICE PRODUCTION

TECHNICAL FIELD

This invention relates to the manufacture of semiconductor devices and, more particularly, to a method relating to the art of thermal gradient zone melting and with establishing and maintaining the desired conditions of temperature gradients throughout the semiconductive material during zone melting.

BACKGROUND OF THE INVENTION

In the manufacture of semiconductor devices, it is normally necessary to alter the conductivity type of selected regions of the semiconductor body by doping the regions with conductivity modifying impurity atoms. Such doping may be accomplished by various techniques known in the art. One such technique is thermal gradient zone melting (TGZM). This technique can produce very abrupt junctions with unusual configurations and high doping concentrations in a body of semiconductor material in a relatively short period of time. Early descriptions of TGZM and some of its applications can be found in U.S. Pat. No. 2,813,048 issued to W. G. Pfann and in his book, *Zone Melting*, copyright by John Wiley and Sons, Inc.

Thermal gradient zone melting is a process in which a small amount of dopant material (generally a metal) is deposited on a selected surface of a semiconductor material, such as a semiconductor wafer or ingot, and the semiconductor body is then exposed to a temperature gradient at an elevated temperature. The overall temperature at which the process is carried out must be sufficiently high in order to form a metal-rich liquid zone in the form of a line, droplet or sheet which zone will be established depending on the initial shape or pattern of the deposited metal dopant material. This liquid zone is caused to migrate through the semiconductive material from the cooler surface to the hotter surface leaving in its path a recrystallized region of semiconductor material containing the metal and solid solution within the semiconductor material in a concentration determined by the solubility limit of the metal therein.

The temperature gradient should be uniform and unidirectional if the pattern of dopant material disposed on the entrance surface of the wafer is to be faithfully reproduced in a crystallized dopant zone or region throughout the semiconductive wafer to the opposite surface of the wafer.

One of the most difficult problems relating to the use of TGZM has been the inability of generating a large uniform thermal gradient across the thickness of a thin fragile semiconductor wafer so as to uniformly reproduce the dopant pattern throughout the wafer. Distortion of the thermal gradient tends to be especially prevalent near the edge of the wafer where heat loss is high.

In one technique of TGZM, as disclosed in U.S. Pat. No. 4,001,047, issued to John K. Boah, infrared radiation is employed to produce a thermal gradient through the semiconductor wafer. However, while this thermal gradient is uniform through most of the wafer, due to additional heat loss at the edge of the wafer as compared with the body of the wafer, the thermal gradients are distorted from their otherwise unidirectional direction. This distortion, in turn, causes distortion of the thermal migration pattern of the dopant in the area around the edge of the wafer making this region unsuitable for device fabrication.

For example, in a 2 inch diameter n-type, 10–20 ohm centimeter, silicon (111) wafer, 10 mils thick, the distorted thermal gradient produced by I.R. radiation in accordance with the teachings of Boah extends as far as 0.25 inch into the center of the wafer, causing sideway migration of the liquid zone in this region and reducing the usable area of the wafer by 44%.

In another technique to obtain a uniform thermal gradient throughout the entire semiconductor body, T. R. Anthony and H. E. Cline, have disclosed in U.S. Pat. No. 3,895,967, a method by which thermal gradient distortion can be minimized around the edge of a thick semiconductor ingot as opposed to a thin semiconductor wafer. This method employs a guard ring of semiconductor material of the same thickness as the semiconductor ingot disposed about and spaced from the peripheral edge of the semiconductor ingot. One requirement of this method is that the space or gap between the guard ring and the semiconductor ingot has to be less than 1/10 of the thickness of the semiconductor ingot. If this gap were not maintained, the guard ring became less effective and thermal distortion problems still are present in the peripheral edge portion of the semiconductor ingot. For thin semiconductor wafers, the requirement that the separation between the guard ring and the wafer be less than 1/10 the thickness of the wafer and that the semiconductor wafer and guard ring be coplanar make the use of guard rings commercially unfeasible for a number of reasons.

In another method described by Anthony and Cline in U.S. Pat. No. 4,035,199 the thermal gradient distortion problem was attacked by depositing quarter wave absorption material on selected areas of the surface of the wafer to supply more heat at the edge of the wafer to compensate for the heat loss around the edge and thereby reduce the sideway migration at the edge of the wafer. This method, however, depends on precise thickness control in depositing the quarter wave absorption material and requires the deposition of such material as a separate additional processing step. In addition the heat absorbing layer is only maintained on the surface of the wafer and does not penetrate the depth of the wafer. This process would therefore be relatively costly to implement and difficult to control and would not result in uniform control of heat loss through the thickness of the wafer.

In summary, the present methods of thermal gradient zone melting processing of thin semiconductor wafers either result in a waste of a large portion of the semiconductor wafer or are associated with costly and/or difficult to control processing. Consequently, a method for reducing the thermal gradient distortion problems around the peripheral edge portion of the wafer which does not result in added steps for processing the wafer and is easily controllable is greatly desired.

SUMMARY OF THE INVENTION

A method of processing a semiconductive wafer by thermal gradient zone melting comprises selecting a suitable semiconductor wafer to be processed and forming a deposit of a metal suitable for thermal migration through the semicoductor body in a desired pattern on a first surface of the semiconductor wafer. The metal pattern on the first surface of the wafer includes a ring of the metal around the periphery of the first surface of the wafer adjacent the edge of the wafer. A heat source is provided to heat the semiconductor wafer, melt the metal pattern and create a thermal gradient within the semiconductor wafer to cause the resulting molten metal to migrate through the semiconductor wafer in the direction of the second surface of the wafer.

DETAILED DESCRIPTION

In accordance with the teachings of this invention, there is provided an improved method for processing a semiconductive wafer by thermal gradient zone melting.

Figure 1A:
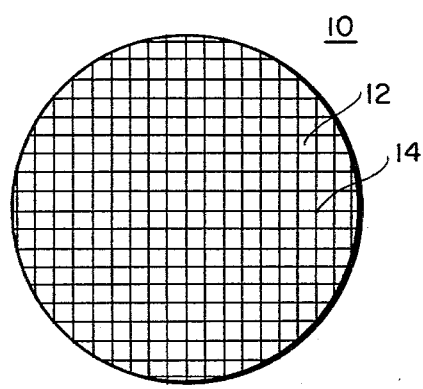
FIG. 1A is an elevational view representative of the first surface of a prior art semiconductor wafer having a grid structure of the dopant metal thereon.
Figure 1B:
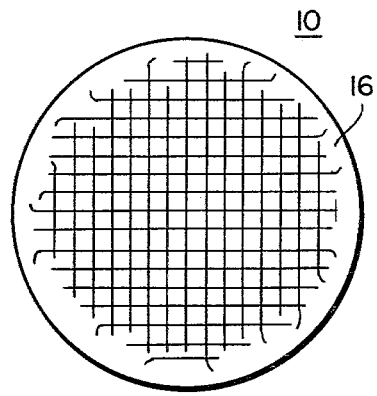
FIG. 1B is an elevational view representative of the wafer shown in FIG. 1A taken from the opposite surface after thermal migration and showing the typical distortion of the thermally migrated pattern around the outer portion of the wafer.

Referring to FIG. 1A, there is shown a wafer 10 of a semiconductor material having a first major surface 12 which has deposited thereon dopant metal 14 to be thermally migrated through the wafer 10. The dopant metal is present on the first surface 12 in the form of a desired pattern, shown here in the form of a grid structure. The semiconductor wafer 10 of FIG. 1A represents a typical prior art semiconductor wafer which does not include a pheripheral ring of metal dopant around the outer edge. FIG. 1B depicts the wafer 10 of FIG. 1A, as observed from the opposite major surface to said first major surface, after thermal migration. In accordance with FIG. 1B, the typically obtained distortion of the thermally migrated pattern around the outer portion of the wafer can readily be observed. Such distortion, represented by the failure of the grid lines to extend to the outer edge of the wafer, can cause a loss of up to 44% of a 2 inch semiconductor wafer.

Figure 2A:
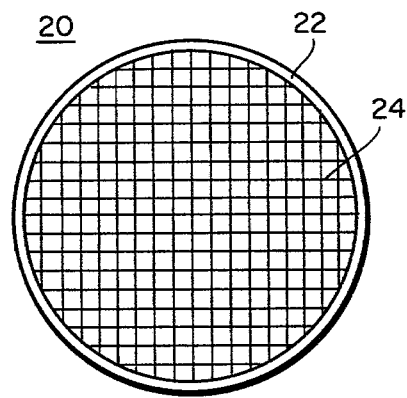
FIG. 2A is an elevational view representative of a wafer having a grid structure of dopant metal on one surface thereof and a peripheral ring of the dopant metal in accordance with this invention.
Figure 2B:
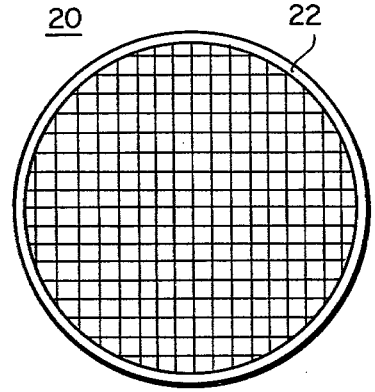
FIG. 2B is an elevational view of the wafer shown in FIG. 2A taken from the opposite surface after thermal migration.
Figure 3:
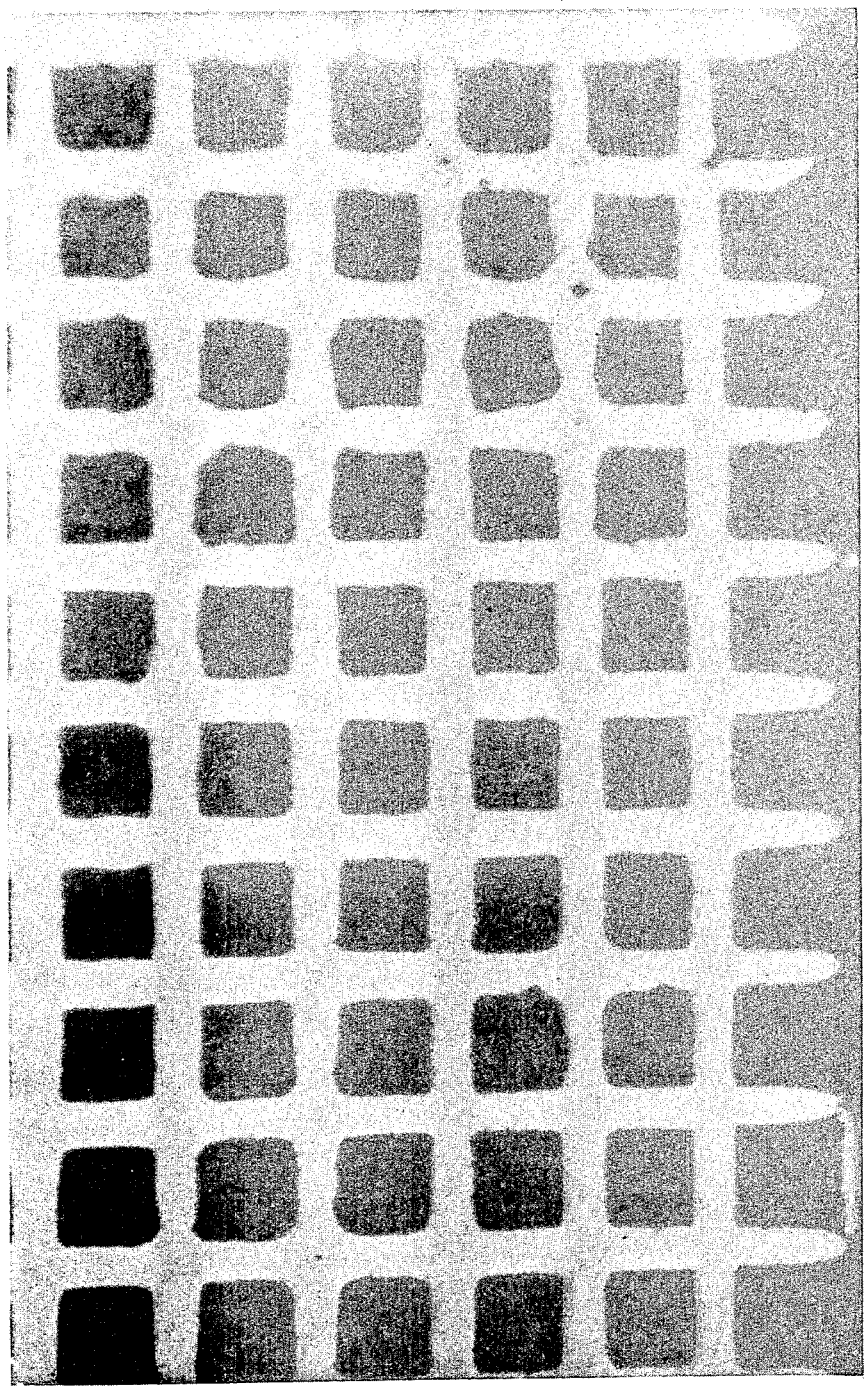
FIG. 3 is a photomicrograph of a portion of the second surface of a semiconductor wafer which has been processed, for comparison purposes, wherein one edge of the first surface included the dopant metal along its periphery while another edge failed to include the dopant metal along its periphery.

Referring now to FIG. 2A there is shown a semiconductor wafer 20 similar to the wafer shown with respect to FIG. 1A except this wafer is provided with an annular peripheral ring of dopant metal 22 together with the normal grid structure 24 of the same dopant metal. FIG. 2B depicts the opposite surface of the wafer of FIG. 2A after thermal migration of the grid pattern. It can be seen that the grid pattern on the first surface is reproduced essentially without distortion on the second surface after thermal migration of the grid pattern when the peripheral ring is provided on the wafer.

For comparison purposes, a photomicrograph of a portion of the second surface of a semiconductor silicon wafer which has been processed by thermal migration and wherein one edge of the first surface included the dopant material along its periphery while another edge failed to include the dopant metal along its periphery is shown. It can be readily observed from this photomicrograph that the grid pattern fails to extend to the edge of the semiconductor wafer along the edge which did not include a dopant metal along its periphery, while the grid pattern is extended to the edge which did contain the dopant metal along its periphery; secondly, there is no lateral distortion of lines of the grid pattern with respect to the lines parallel to the edge containing the dopant material while lateral distortion is observed with respect to the lines parallel to the edge devoid of dopant metal along its periphery. It is believed that the lack of distortion achieved when using a peripheral ring of dopant metal is due to the compensation for the heat loss at the edge of the wafer. This compensation is believed to arise from the migration of a liquid zone through the wafer in the form of a continuous line along the edge of the wafer simultaneously with the migration of the grid pattern. Due to the differences in the thermal conductivities and heat absorption characteristics between the liquid zone and the solid semiconductor material at the corresponding locations, the liquid zone contains more heat content than that of the semiconductor material. Thus, a migrating liquid zone at the edge of the wafer can be used as a reservoir of heat energy to supply heat to the wafer and compensate for the heat loss from the edge of the water. The sideway migration at the edge of the wafer is thereby prevented or reduced.

This technique has the advantage of being easy to apply and does not require any additional processing steps since the edge line or peripheral ring is deposited during the same step as the formation of the metal pattern.

The improved process includes selecting a wafer of semiconductor material having suitable crystal structure, conductivity type and resistivity. The wafer has two major opposed surfaces which are, respectively, the top and bottom surfaces thereof. At least one of the major surfaces has a preferred planar crystal orientation. Typically, the semiconductor material is single crystal silicon and the crystal orientation is selected from the group consisting of (100), (110) and (111). The wafer has a vertical axis which is substantially aligned with a first crystal axis of the material of the body of the wafer. It is preferred that the wafer crystal orientation is (111). If other orientations are employed, the peripheral metal layer must follow a set pattern based upon the stable crystal orientation. Reference can be made to U.S. Pat. No. 4,035,199 giving line stability dependence on crystal orientation.

A layer of metal which includes at least one suitable dopant material that will impart to the semiconductor wafer a predetermined type conductivity and a predetermined level of resistivity is deposited on the bottom surface of the wafer in a predetermined pattern. The pattern includes a ring of the metal around the periphery of the wafer. A suitable dopant material for n-type silicon is aluminum and a typical pattern used is that of a grid structure.

Preferably, the silicon wafer is oriented so that the major surfaces are in the (111) crystallographic plane. Under these conditions, the aluminum metal deposited on the bottom surface will migrate as a melt along the <111> axis of the material of the wafer. The aluminum is preferably initially alloyed to the bottom surface of the wafer. This alloying step helps assure uniform wetting between the silicon and the aluminum to achieve best results.

The wafer having the metal pattern on the bottom surface is then placed in a thermal migration apparatus with the top surface facing a radiant energy source such as an infrared lamp. The bottom surface generally faces a cold black bodied heat sink. Thermal migration is initiated when the radiant heat source is energized and the wafer is heated to a temperature sufficient to melt the aluminum. First, an aluminum rich melt of silicon is formed on the bottom surface maintaining the initial pattern. The melt dissolves the silicon on the hottest side thereof and concurrently, aluminum doped silicon will begin to recrystallize on the coolest side thereof as the melt migrates through the solid material of the wafer in the direction of the hot surface. Behind the migrating melt a region of recrystallized silicon semiconductor material doped with aluminum to the solid solubility limit in silicon, as determined by the temperature at which migration is practiced, will be deposited.

If the process is continued for a sufficient period of time (typically 2 to 15 minutes) depending on wafer thickness, temperature, temperature gradient, etc., the melt will emerge on the hot surface of the wafer and the recrystallized region will have passed through the entire wafer.

Although the invention has been described by using aluminum as part of or as the entire melt other suitable materials may be employed to impart either n-type conductivity, p-type conductivity and intrinsic type conductivity. Also, while it is more practicable to employ the same metal for the peripheral ring as the metal used in the patterned structure to be migrated through the semiconductor wafer, it is possible to use a metal other than the metal used in the remainder of the pattern for the peripheral ring.

By way of example, thermal migration of aluminum through an n-type, 10-20 ohm centimeter silicon (111) wafer of 10 mils thickness was performed. A grid pattern of 40×40 mils with 6 mils line width was generated on the first surface of the wafer by conventional photolithographic and selective etching methods. Thermal migration was performed at 1220° C. with an estimated temperature gradient of about 50°-100° C. per centimeter. The grid pattern included an annular ring of aluminum about the outer periphery of the first surface adjacent the edge of the semiconductor wafer. Thermal migration was continued until the grid pattern was migrated completely through the wafer to the opposite surface of the wafer. The resulting wafer showed no substantial distortion of the grid pattern and all grid lines extended to the edge of the wafer.

It has been found that the degree of elimination or reduction of the distortion due to the edge effect depends upon the width and thickness of the peripheral metal layer. This combination of width and thickness relates to the total amount of metal contributing to offsetting the heat loss at the edge. A preferred range of metal width appears to be about 20-40 mils wide for a thickness of from about 8-10 microns. Below this range, for wafers about 10 mils thick and gradients of from 50°-100° C./cm. some distortion, which may be significant, is still present after migration while above this range there is an overcompensation of heat loss and distortion starts to appear in the opposite direction.

What is claimed is:

1. A method of processing a semiconductor wafer by thermal gradient zone melting, comprising:
   selecting a suitable semiconductor wafer to be processed,
   depositing a metal suitable for thermal migration through said semiconductor wafer in a desired pattern on a first surface of said wafer,
   said metal pattern including a layer of metal around the periphery of said first surface of said wafer adjacent the edge of said wafer, and
   heating the wafer so as to cause the metal of said pattern to melt and to cause the thermal gradient migration through said semiconductor wafer in the directon of the second surface of said wafer.

2. The method recited in claim 1 wherein said semiconductor wafer is single crystal silicon.

3. The method recited in claim 1 wherein said semiconductor wafer is single crystal silicon and wherein said surfaces are in the crystallographic direction.

4. The method recited in claim 1 wherein said semiconductor is single crystal silicon and wherein said metal is aluminum.

5. The method recited in claim 1 wherein the thickness of the peripheral metal layer is from about 8-10 microns while the layer width is from about 20-40 mils.

* * * * *

UNITED STATES PATENT OFFICE
CERTIFICATE OF CORRECTION

PATENT NO. : 4,190,467
DATED : February 26, 1980
INVENTOR(S) : Suei-Yuen P. Lien It is certified that error appears in the above-identified patent and that said Letters Patent are hereby corrected as shown below:

In the claims, Column 6, line 39, "the crystallographic" should read --the (111) crystallographic--.

Signed and Sealed this

Twenty-ninth Day of July 1980

[SEAL]

Attest:

SIDNEY A. DIAMOND

Attesting Officer

Commissioner of Patents and Trademarks